(12) United States Patent
Tian et al.

(10) Patent No.: US 11,956,909 B2
(45) Date of Patent: *Apr. 9, 2024

(54) CURLING DEVICE AND FLEXIBLE DISPLAY DEVICE

(71) Applicants: Hefei BOE Optoelectronics Technology Co., Ltd., Anhui (CN); BOE Technology Group Co., Ltd., Beijing (CN)

(72) Inventors: Wei Tian, Beijing (CN); Tingting Chen, Beijing (CN); Jun Zhang, Beijing (CN)

(73) Assignees: Hefei BOE Optoelectronics Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 323 days.

This patent is subject to a terminal disclaimer.

(21) Appl. No.: 17/468,565

(22) Filed: Sep. 7, 2021

(65) Prior Publication Data

US 2022/0078931 A1 Mar. 10, 2022

(30) Foreign Application Priority Data

Sep. 10, 2020 (CN) .......................... 202021976646.0

(51) Int. Cl.
*H01H 47/00* (2006.01)
*H01F 7/14* (2006.01)
*H05K 5/00* (2006.01)
*H05K 5/02* (2006.01)

(52) U.S. Cl.
CPC ............ *H05K 5/0217* (2013.01); *H01F 7/14* (2013.01); *H05K 5/0017* (2013.01)

(58) Field of Classification Search
None
See application file for complete search history.

(56) References Cited

U.S. PATENT DOCUMENTS 11,116,085 B2 * 9/2021 Gao .................... H05K 5/0017
2019/0324502 A1 * 10/2019 Chang ................. G06F 1/1652

* cited by examiner

Primary Examiner — Stephen W Jackson
(74) Attorney, Agent, or Firm — IPro, PLLC

(57) ABSTRACT

A curling device and a flexible display device are provided. The curling device includes: the electromagnetic telescoping mechanism and the controller are in communication connection; the electromagnetic telescopic mechanism is configured to connect with the flexible display panel element and expanding under the action of the magnetic field when receiving a first signal of the controller so as to drive the flexible display panel element to expand; when a second signal of the controller is received, the flexible display panel element is curled, so that the flexible display panel element is driven to curl.

20 Claims, 9 Drawing Sheets

CURLING DEVICE AND FLEXIBLE DISPLAY DEVICE

CROSS-REFERENCE TO RELATED APPLICATIONS

This application claims priority to Chinese Patent Application No. 202021976646.0 filed in China on Sep. 10, 2020, the entire contents of which are incorporated herein by reference.

TECHNICAL FIELD

The present disclosure relates to the field of display technologies, and in particular, to a curling device and a flexible display device.

BACKGROUND

With the development of display technology, more and more flexible display devices are on the market. Compared with the traditional display device, the flexible display device has remarkable advantages such as reduced volume, portability, wide application range and the like.

However, the current flexible display devices including tablet computers, notebook computers and smart televisions have certain limitations in portability, which cannot embody the main advantages of the flexible display devices, and therefore how to achieve the curling of the flexible display panel of the flexible display device is a problem that needs to be solved urgently in the field of the current flexible display devices.

SUMMARY

In a first aspect, a curling device is provided, including: an electromagnetic telescoping mechanism and a controller in a communication connection, where the electromagnetic telescopic mechanism is configured to:

connect with a flexible display panel element, and expand under an action of a magnetic field when receiving a first signal of the controller to drive the flexible display panel element to expand; and when receiving a second signal of the controller, curl to drive the flexible display panel element to curl.

Optionally, the electromagnetic telescoping mechanism includes a plurality of electromagnetic telescoping elements;

each flexible display panel element includes a crawler belt and an electromagnetic element, and is clamped between the crawler belt and the electromagnetic element;

there exists a gap between the electromagnetic elements of two adjacent electromagnetic telescopic elements, the electromagnetic elements include a coil, and electric polarities of coil terminals in two adjacent electromagnetic elements are opposite.

Optionally, the electromagnetic telescoping mechanism is further coupled to a rotating shaft, the rotating shaft is configured to move the electromagnetic telescoping mechanism.

Optionally, the electromagnetic telescoping element further includes a support member, an elastic member, and a connecting shaft;

the crawler belts of two adjacent electromagnetic telescopic elements are connected through the connecting shaft;

the support member is arranged in the crawler belt and connected with the connecting shaft;

the elastic piece is arranged in the crawler belt, and two ends of the elastic piece are respectively connected with the support member and a side wall of the crawler belt close to the electromagnetic element and are configured to provide a pressure for the support member.

Optionally, an angle between the crawler belts of two adjacent electromagnetic telescopic elements is in a range of −180°.

Optionally, the electromagnetic element is trapezoidal in a cross-section perpendicular to a length of the crawler belt.

Optionally, the coil of the electromagnetic element is provided with a circuit switch:

the circuit switch is configured to receive a first signal and a second signal and control a connection and a disconnection of the coil and a power supply in response to the first signal and the second signal.

Optionally, the electromagnetic telescoping mechanism includes a telescoping cylinder and at least one first telescoping element and at least one second telescoping element arranged within the telescoping cylinder;

the at least one first telescoping element and the at least one second telescoping element are arranged alternately;

the first telescopic element is fixedly connected with the telescopic cylinder;

the second telescopic element is provided with a coil and is configured to:

rotate under an action of a magnetic field and lock with the first telescopic element when receiving the first signal, to enable the electromagnetic telescopic mechanism to expand, and rotate under an action of a magnetic field and is unlocked with the first telescopic element when receiving the second signal, to enable the electromagnetic telescopic mechanism to curl.

Optionally, the first telescoping element includes a first telescoping element body and first locking mechanisms arranged at both ends of the first telescoping element body;

the second telescopic element includes a second telescopic element body and second locking mechanisms arranged at two ends of the second telescopic element body, and a coil is twined on the second telescopic element body;

the first locking mechanism is matched with the second locking mechanism, to lock and unlock the first telescopic element and the second telescopic element.

Optionally, the controller includes an circular track and an electromagnetic element;

the circular track surrounds the telescopic cylinder;

the electromagnetic member is configured to be movable along the circular track to lock and unlock the first locking mechanism and the second locking mechanism.

Optionally, when the electromagnetic element moves to a first position along the circular track, the second telescopic element rotates to a locking position under an action of a magnetic field of the electromagnetic element, and the second locking mechanism is locked with the first locking mechanism;

when the electromagnetic element moves to a second position along the circular track, the second telescopic element rotates to an unlocking position under the action of the magnetic field of the electromagnetic element, and the second locking mechanism is unlocked with the first locking mechanism.

Optionally, the curling device further includes a housing and a pipe arranged within the housing for the electromagnetic telescoping mechanism to enter and exit the housing;

a support transmission mechanism is arranged on a side of the pipe and is configured to support the electromagnetic telescopic mechanism and drive the electromagnetic telescopic mechanism to move.

In a second aspect, a flexible display device is provided, including a flexible display panel element and a curling device;

where the curling device includes: an electromagnetic telescoping mechanism and a controller in a communication connection, where the electromagnetic telescopic mechanism is configured to:

connect with a flexible display panel element, and expand under an action of a magnetic field when receiving a first signal of the controller to drive the flexible display panel element to expand; and when receiving a second signal of the controller, curl to drive the flexible display panel element to curl.

Optionally, a fixing member is arranged at a first side of the flexible display panel element;

at least one side edge of the flexible display panel element, which is adjacent to the first side edge, is connected with the electromagnetic telescopic mechanism.

Optionally, the electromagnetic telescoping mechanism includes a plurality of electromagnetic telescoping elements;

each flexible display panel element includes a crawler belt and an electromagnetic element, and is clamped between the crawler belt and the electromagnetic element;

there exists a gap between the electromagnetic elements of two adjacent electromagnetic telescopic elements, the electromagnetic elements include a coil, and electric polarities of coil terminals in two adjacent electromagnetic elements are opposite.

Optionally, the electromagnetic telescoping mechanism is further coupled to a rotating shaft, the rotating shaft is configured to move the electromagnetic telescoping mechanism.

Optionally, the electromagnetic telescoping element further includes a support member, an elastic member, and a connecting shaft;

the crawler belts of two adjacent electromagnetic telescopic elements are connected through the connecting shaft;

the support member is arranged in the crawler belt and connected with the connecting shaft;

the elastic piece is arranged in the crawler belt, and two ends of the elastic piece are respectively connected with the support member and a side wall of the crawler belt close to the electromagnetic element and are configured to provide a pressure for the support member.

Optionally, an angle between the crawler belts of two adjacent electromagnetic telescopic elements is in a range of 140°-180°.

Optionally, the electromagnetic element is trapezoidal in a cross-section perpendicular to a length of the crawler belt.

Optionally, the coil of the electromagnetic element is provided with a circuit switch;

the circuit switch is configured to receive a first signal and a second signal and control a connection and a disconnection of the coil and a power supply in response to the first signal and the second signal.

BRIEF DESCRIPTION OF THE DRAWINGS

The above and; or additional aspects and advantages of the present disclosure will become apparent and readily appreciated from the following description of the embodiments, taken in conjunction with the accompanying drawings of which.

DETAILED DESCRIPTION

Figure 1:
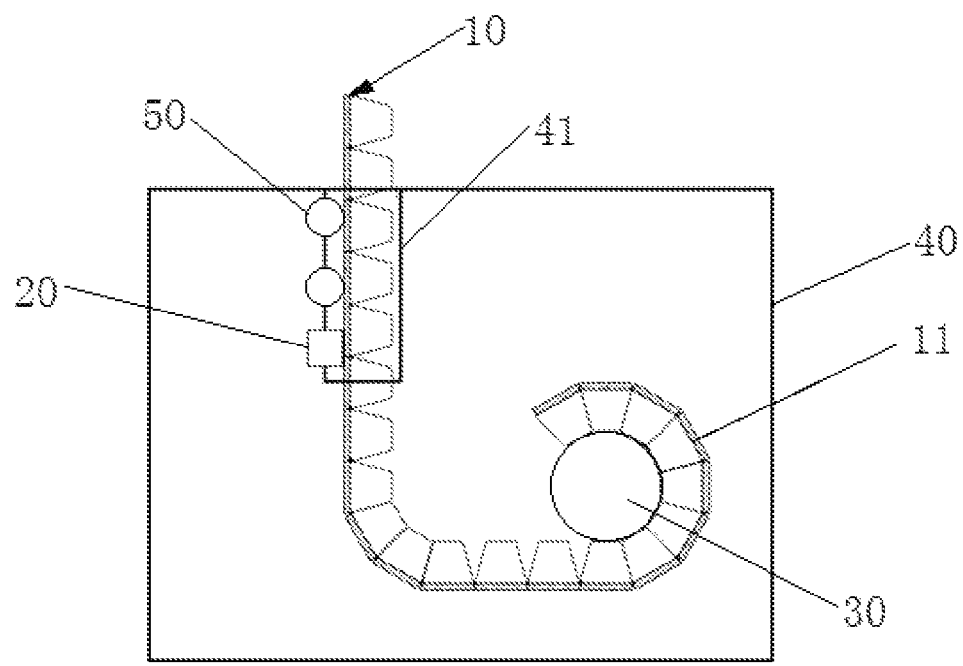
FIG. 1 is a schematic structural view of a curling device according to an embodiment of the present disclosure.

Reference will now be made in detail to the present disclosure, examples of which are illustrated in the accompanying drawings, wherein like reference numerals refer to the same or similar elements or elements having the same or similar functions throughout. In addition, if a detailed description of known technologies is not necessary for illustrating the features of the present disclosure, it is omitted. The embodiments described below with reference to the accompanying drawings are illustrative only for the purpose of explaining the present disclosure, and are not to be construed as limiting the present disclosure.

It will be understood by those skilled in the art that, unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the singular forms "a", "an", "the" and the are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" to another element, it can be directly connected to the other element or intervening elements may also be present. Further, "connected" or "coupled" as used herein may include wirelessly connected or wirelessly coupled. As used herein, the term "and/or" includes all or any element and all combinations of one or more of the associated listed items.

The embodiment of the present disclosure provides a curling device, a schematic structural diagram of which is shown in FIG. 1, and the curling device includes: the electromagnetic telescoping mechanism 10 and the controller 20 are in communication connection; the electromagnetic telescopic mechanism 10 is configured to connect with the flexible display panel element, and when receiving a first signal of the controller 20, the electromagnetic telescopic mechanism expands under an action of a magnetic field so as to drive the flexible display panel element to curl; when receiving the second signal from the controller 20, the flexible display panel element is curled.

The curling device provided by the embodiment of the disclosure controls the expanding and curling of the electromagnetic telescoping mechanism 10 through the controller 20, and effectively realizes the expanding and curling of the flexible display panel element connected with the electromagnetic telescoping mechanism 10.

Specifically, in the embodiment of the present disclosure, the electromagnetic telescopic device 10 is connected to the flexible display panel element, and when receiving a first signal from the controller 20, the electromagnetic telescopic device is expanded under the action of the magnetic field to drive the flexible display panel element to expand; when receiving the second signal from the controller 20, the flexible display panel element is curled, thereby realizing the expanding and the curling of flexible display panel element. By controlling the expanding and the curling of control flexible display panel element, it is able to accommodate the flexible display panel element, improve the portability of flexible display panel element, and extend the application scene.

Meanwhile, in the curling device provided by the embodiment of the disclosure, the electromagnetic expanding device 10 is controlled to curl and curled in an electromagnetic mode, so that the automation level of the curling device is improved, and the use of a user is facilitated.

Figure 2:
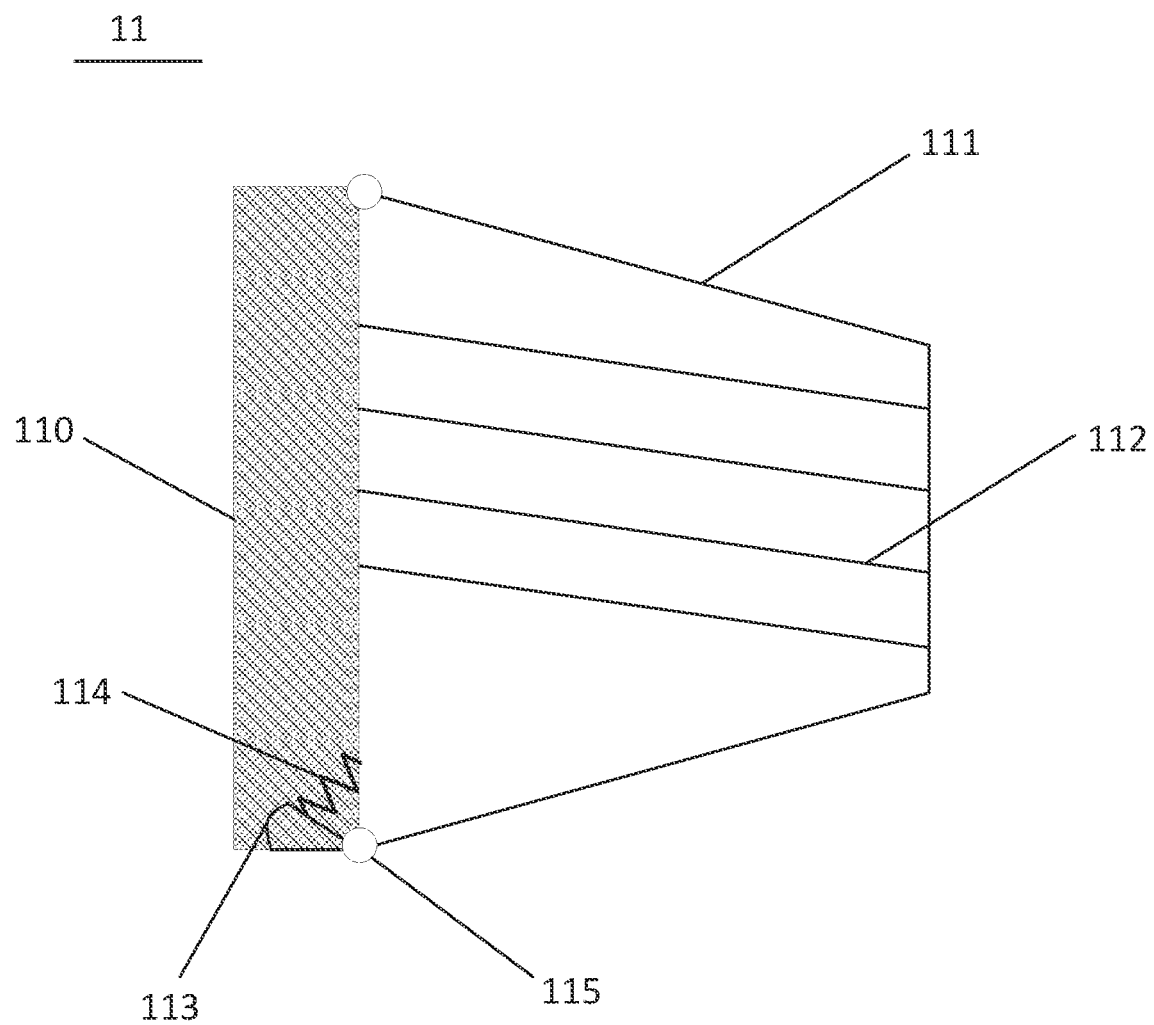
FIG. 2 is a schematic structural diagram of an electromagnetic telescopic element in the curling device shown in FIG. 1 according to an embodiment of the present disclosure.

In one embodiment of the present disclosure, the electromagnetic retracting mechanism 10 includes a plurality of electromagnetic retracting elements 11. As shown in FIG. 2, which is a schematic structural diagram of the electromagnetic telescopic element, the electromagnetic telescopic element 11 includes a crawler 110 and an electromagnetic element 111, and the flexible display panel element is sandwiched between the crawler 110 and the electromagnetic element 111; a gap is arranged between the electromagnetic elements 111 of any two adjacent electromagnetic telescopic elements 11, and the electromagnetic elements 111 comprise coils 112, and the electric polarities of the terminals of the coils 112 in any two adjacent electromagnetic elements 111 are opposite.

In the embodiment of the present disclosure, the electromagnetic telescopic mechanism 10 includes a plurality of electromagnetic telescopic elements 11, and since a gap is provided between the electromagnetic elements 111 of any two adjacent electromagnetic telescopic elements 11, when two adjacent electromagnetic elements 111 approach each other, the crawler belt 110 may be driven to curl, so as to drive the flexible display panel element clamped between the crawler belt 110 and the electromagnetic elements 111 to curl; when two adjacent electromagnetic elements 111 keep away from each other, can drive crawler belt 110 exhibition flat, and then drive the exhibition flat of flexible display panel element.

Figure 3:
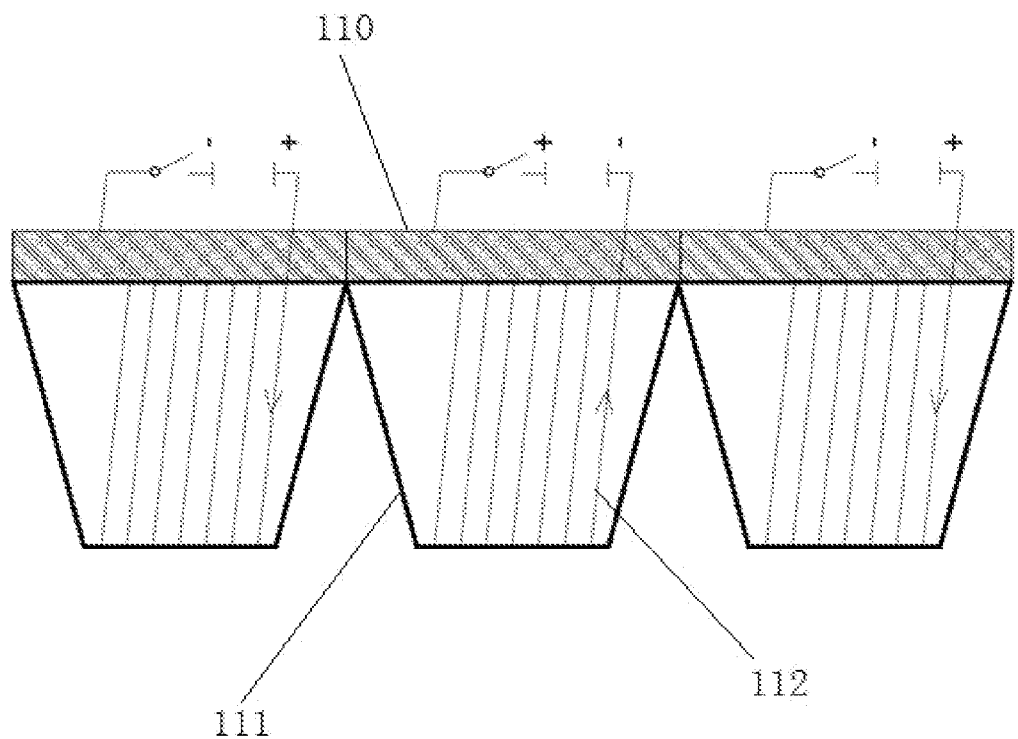
FIG. 3 is a schematic view of a connection of a coil circuit in an electromagnetic telescoping mechanism of the curling device shown in FIG. 1 according to an embodiment of the disclosure.

Meanwhile, as shown in FIG. 3, a schematic view of a connection of a coil circuit in an electromagnetic telescoping mechanism in the curling device is shown, wherein "+" in FIG. 3 represents a positive electrode of the coil connected to a power supply, and "−" represents a negative electrode of the coil connected to the power supply. In the embodiment of the present disclosure, the electrical polarities of the terminals of the coils 112 in any two adjacent electromagnetic elements 111 are opposite, and thus the arrangement is that when the power supply of the coils 112 is turned on, because the current directions of the coils 112 of the two adjacent electromagnetic elements 111 are opposite, the directions of the magnetic fields generated by the coils 112 of the two adjacent electromagnetic elements 111 are opposite, and the two adjacent electromagnetic elements 111 can repel each other under the action of the magnetic field, so that the two electromagnetic elements 111 are away from each other, and the crawler belt 110 is driven to be flattened, thereby driving the flexible display panel element to be flattened.

Figure 4:
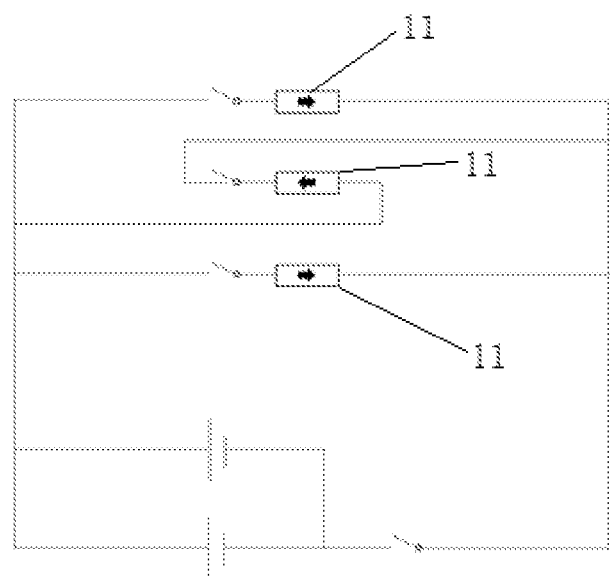
FIG. 4 is a schematic view of a coil circuit in the electromagnetic telescoping mechanism of FIG. 1 according to an embodiment of the disclosure.

It should be noted that, as shown in FIG. 4, which is a schematic view of a coil circuit, in the embodiment of the present disclosure, in order to simplify a connection structure of the coil circuit, the electromagnetic elements 111 of the adjacent multiple electromagnetic telescopic elements 11 may be connected to the same power supply, and by changing a winding direction of the coil 112, when the power supply is turned on, current directions of the coils 112 of the adjacent two electromagnetic elements 111 are opposite, so that directions of magnetic fields generated by the coils 112 of the adjacent two electromagnetic elements 111 may also be opposite. In order to improve the reliability of the device, the power supply for the coil in the electromagnetic telescoping element 11 includes a main power supply and a backup power supply to ensure the stability of the operation of the curling device. Meanwhile, the electromagnetic units 111 of the plurality of electromagnetic stretching units 11 are connected to the same power supply in a parallel connection manner, so that whether each electromagnetic stretching unit 11 is electrified or not can be controlled independently.

In the embodiment of the present disclosure, the crawler belt 110 and the electromagnetic element 111 are both made of hard insulating materials such as ceramic and plastic, which can effectively prevent the electromagnetic telescopic element 11 from being affected by deformation of each component due to stress during the expanding and curling processes of the electromagnetic telescopic element 11.

In one embodiment of the present disclosure, as shown in FIG. 1, the electromagnetic telescoping mechanism 10 is further connected to a rotating shaft 30, and the rotating shaft 30 is used for driving the electromagnetic telescoping mechanism 10 to move. In the embodiment of the present disclosure, the rotating shaft 30 is directly connected to the electromagnetic telescoping mechanism 10, and the efficiency and the speed of expanding and curling of the electromagnetic telescoping mechanism 10 can be improved by controlling the rotating direction and the rotating speed of the rotating shaft 30.

In one embodiment of the present disclosure, as shown in FIG. 2, the electromagnetic telescopic element 11 further includes a support member 113, an elastic member 114, and a connection shaft 115 the caterpillar bands 110 of any two adjacent electromagnetic telescopic elements 11 are connected through a connecting shaft 115; the supporting member 113 is arranged in the crawler belt 110, connected to the connecting shaft 115, and capable of rotating around the connecting shaft 115; the elastic member 114 is arranged in the crawler belt 110, and both ends of the elastic member 114 are respectively connected to the support 113 and the side wall of the crawler belt 110 near the electromagnetic element 111, and provide pressure to the support 113.

In the embodiment of the present disclosure, the crawler belts 110 of any two adjacent electromagnetic telescopic elements 11 are connected by the connecting shaft 115, and the two adjacent electromagnetic telescopic elements 11 rotate around the rotating shaft 115, so that the rolling and expanding of the electromagnetic telescopic mechanism 10 are ensured. In order to further ensure the rolling and expanding of the electromagnetic telescopic mechanism 10 and avoid the interference between the adjacent crawler belts 110, in the embodiment of the present disclosure, the connecting shaft 114 is arranged on a side of the crawler belt 110 close to the electromagnetic element 111.

The support 113 is arranged in the crawler belt 110 and connected to the connecting shaft 115, the elastic member 114 is arranged in the crawler belt 110, and two ends of the elastic member 114 are respectively connected to the support 113 and the side wall of the crawler belt 110 near the electromagnetic element 111, and provide pressure to the support 113, so that the support 113 drives the crawler belt 110 to rotate around the rotating shaft 115, and thus two adjacent electromagnetic telescopic elements 11 approach each other, and the electromagnetic telescopic mechanism 10 is curled. When the coils 112 of two adjacent electromagnetic telescopic elements 11 are energized, the two electromagnetic elements 111 are far away from each other under the action of the magnetic field and overcome the pressure of the elastic member 114, so that the electromagnetic telescopic mechanism 10 is flattened.

In the embodiment of the present disclosure, the supporting member 113 is made of a hard insulating material such as ceramic or plastic, and the elastic member 114 includes a spring, an elastic rubber block, or the like, which can provide pressure to the supporting member 113.

In one embodiment of the present disclosure, the angle between the crawler belts 110 of two adjacent electromagnetic telescopic elements 11 ranges from 140° to 180°. It should be noted that in the disclosed embodiments, the included angle ranges from 140° to 180°.

Alternatively, the cross-section of the electromagnetic element 111 is trapezoidal in a direction perpendicular to the length of the crawler belt 110. In the embodiment of the present disclosure, the electromagnetic elements 111 are configured as a trapezoid, so that the range of the included angle between the two crawler belts 110 of two adjacent electromagnetic telescopic elements 11 can be controlled, for example, by adjusting the inner angle of the trapezoid, the included angle between the two crawler belts 110 of two adjacent electromagnetic telescopic elements 11 in the rolling state can be controlled. Meanwhile, when the electromagnetic telescopic mechanism 10 is in a curled state, the electromagnetic elements 111 of two adjacent electromagnetic telescopic elements 11 can be attached to each other, so that the structural integrity is guaranteed.

In one embodiment of the present disclosure, the coil 112 of the electromagnetic element 111 is provided with a circuit switch (not shown in the figure); the circuit switch is configured to receive the first signal and the second signal sent by the controller 20, and controlling the connection and disconnection of the coil 112 and the power supply according to the first signal and the second signal.

Figure 5:
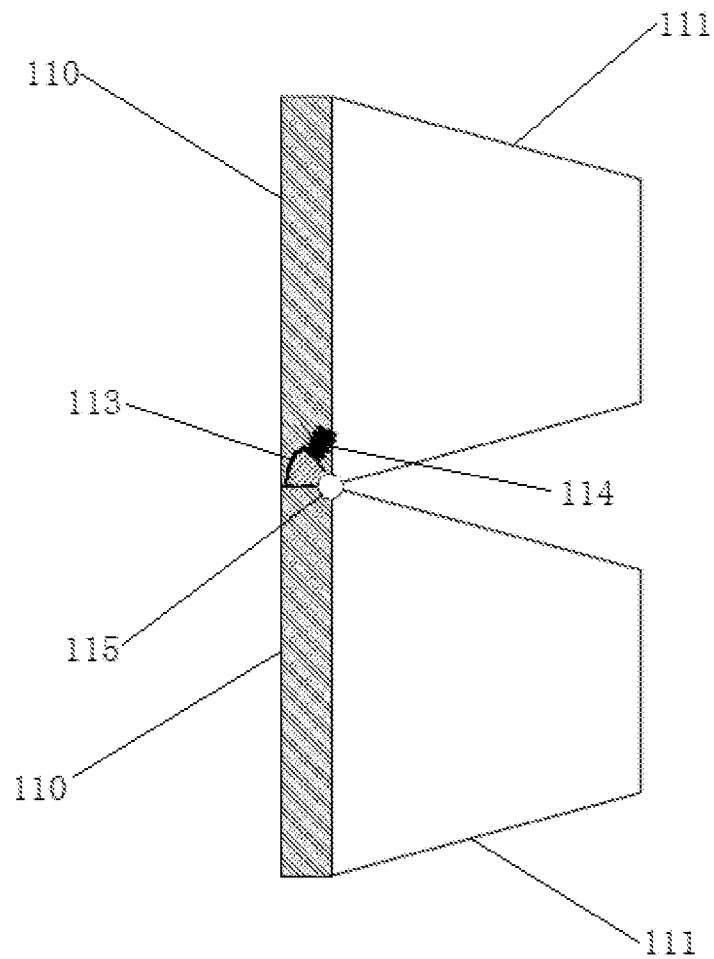
FIG. 5 is a schematic view of a flattened state of an electromagnetic telescoping mechanism in the curling device shown in FIG. 1 according to an embodiment of the present disclosure.
Figure 6:
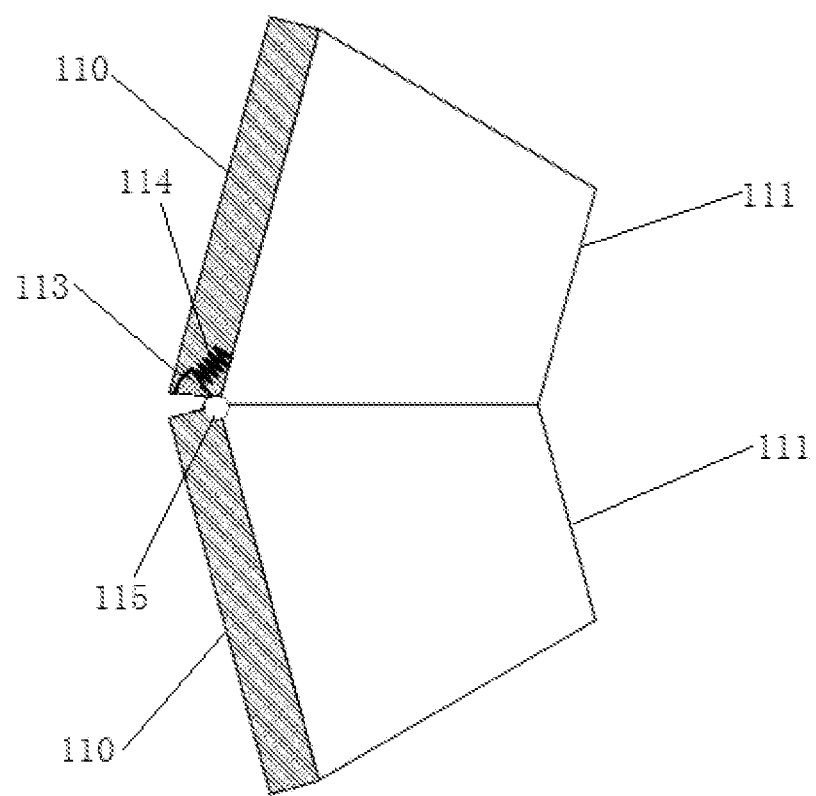
FIG. 6 is a schematic view of a curling state of an electromagnetic retracting mechanism in the curling device shown in FIG. 1 according to an embodiment of the disclosure.

Specifically, as shown in FIG. 5, a schematic view of a state where the electromagnetic stretching mechanism 10 in the curling device in FIG. 1 is stretched out is shown, and FIG. 6 is a schematic view of a state where the electromagnetic stretching mechanism 10 in the curling device in FIG. 1 is curled. In the process that the electromagnetic telescoping mechanism 10 is changed from the coiled state to the flat state, the electromagnetic telescoping mechanism 10 is driven by the rotating shaft 30 to move, each electromagnetic telescoping element 11 of the electromagnetic telescoping mechanism 10 sequentially passes through the controller 20, when the first electromagnetic telescoping element 11 passes through the controller 20 for the first time, a circuit switch of the electromagnetic telescoping element 11 receives a first signal sent by the controller 20, and the circuit switch controls communication between a coil 112 in the electromagnetic telescoping element 11 and a power supply according to the first signal, so that the first electromagnetic telescoping element 11 generates a first magnetic field; when the second electromagnetic telescopic element 11 passes through the controller 20 for the first time, the circuit switch of the electromagnetic telescopic element 11 receives the first signal sent by the controller 20, and the circuit switch controls the communication between the coil 112 in the electromagnetic telescopic element 11 and the power supply according to the first signal, so that the second electromagnetic telescopic element 11 generates the second magnetic field. Since the direction of the first magnetic field is opposite to the direction of the second magnetic field, the electromagnetic element 111 of the first electromagnetic telescopic element 11 and the electromagnetic element 111 of the second electromagnetic telescopic element 11 are far away from each other, and when the repulsive force of the magnetic fields between the two electromagnetic elements 111 is greater than the pressure provided by the elastic member 114 to the support member 113, the first electromagnetic telescopic element 11 and the second electromagnetic telescopic element 11 are aligned on a straight line due to the limitation of the respective caterpillar crawler belts 110, and at this time, the electromagnetic telescopic mechanism 10 is changed from the rolled state to the flat state.

Similarly, in the process that the electromagnetic telescoping mechanism 10 is changed from the flat state to the curled state, the electromagnetic telescoping mechanism 10 moves in the reverse direction under the driving of the rotating shaft 30, each electromagnetic telescoping element 11 of the electromagnetic telescoping mechanism 10 sequentially passes through the controller 20, when the first electromagnetic telescoping element 11 passes through the controller 20 for the second time, the circuit switch of the electromagnetic telescoping element 11 receives the second signal sent by the controller 20, and the circuit switch controls the closing of the coil 112 and the power supply in the electromagnetic telescoping element 11 according to the second signal, so that the first electromagnetic telescoping element 11 approaches to the adjacent electromagnetic telescoping element 11 under the action of the supporting member 113 and the elastic member 114, and further, the curling of the electromagnetic telescoping mechanism 10 is realized.

It should be noted that, in the embodiment of the present disclosure, the controller 20 is specifically a laser generator, the circuit switch includes an optical sensor for receiving laser light emitted by the laser generator, and when the circuit switch receives the laser light with a specific wavelength emitted by the laser generator for the first time, the circuit switch controls the connection between the coil 112 in the electromagnetic expanding element 11 and the power supply; when the circuit switch receives the laser with the specific wavelength emitted by the laser generator for the second time, the circuit switch controls the coil 112 in the electromagnetic expanding element 11 and the power supply to be turned off. In the embodiment of the present disclosure, a current adjusting device may be further arranged in the coil 112, and the current in the coil 112 may be adjusted and controlled by the current adjusting device, so as to control the size of the generated magnetic field, and further adjust the curling angle of the electromagnetic telescoping mechanism 10, so that the electromagnetic telescoping mechanism 10 has a plurality of bending states between the curling state and the flat state, thereby enriching the display states of the flexible display panel element.

Figure 7:
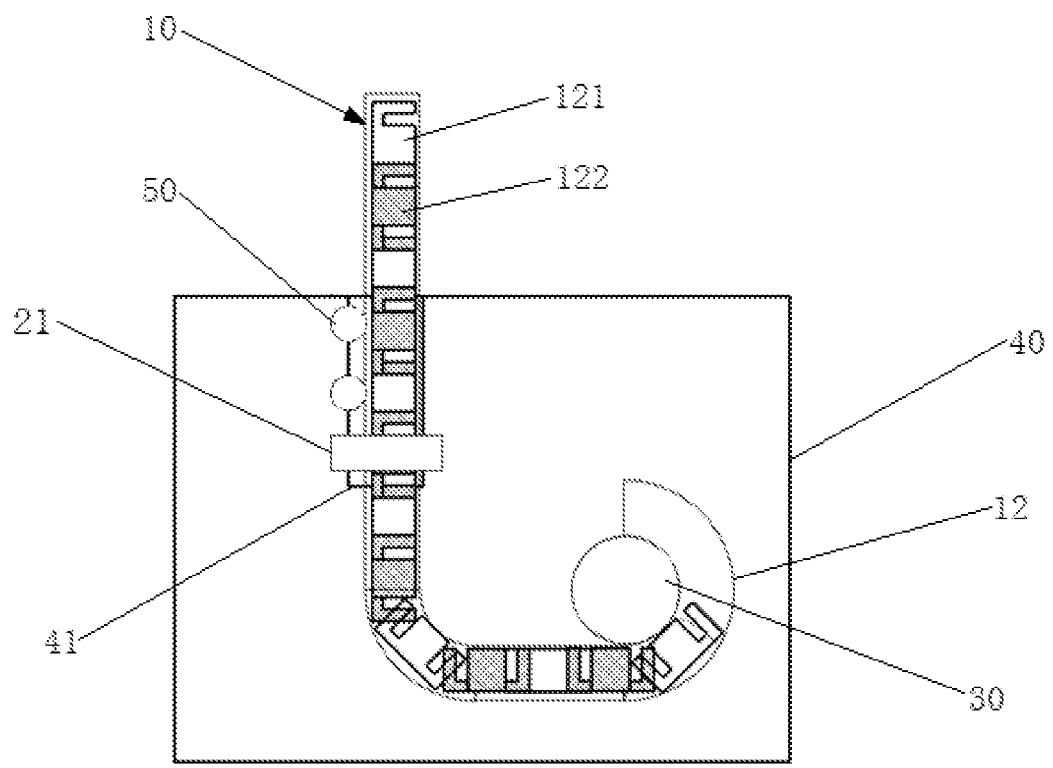
FIG. 7 is a schematic view of another alternative curling device according to an embodiment of the present disclosure.

In an embodiment of the present disclosure, as shown in FIG. 7, a schematic structural diagram of another curling device provided for the embodiment of the present disclosure is shown. In the curling device, the electromagnetic telescoping mechanism 10 comprises a telescoping cylinder 12, and at least one first telescoping element 121 and at least one second telescoping element 122 which are arranged in the telescoping cylinder 12; the first telescopic elements 121 and the second telescopic elements 122 are arranged alternately; the first telescopic element 121 is fixedly connected with the telescopic cylinder; the second telescopic element 122 is provided with a coil, and is configured to rotate under the action of the magnetic field and locking with the first telescopic element 121 when receiving the first signal, so that the electromagnetic telescopic mechanism 10 is unfolded; upon receiving the second signal, it rotates under the action of the magnetic field and unlocks from the first telescopic element 121, so that the electromagnetic telescopic mechanism 10 is curled.

In the embodiment of the present disclosure, the first telescopic elements 121 and the second telescopic elements 122 are alternately arranged in the telescopic cylinder 12, and the first telescopic elements 121 are fixedly connected to the telescopic cylinder 12. The second telescopic element 122 is not fixedly connected with the telescopic cylinder 12, and the second telescopic element 122 is provided with a coil, when the coil is powered on and receives a first signal sent by the controller, the second telescopic element 122 rotates under the action of the magnetic field and is locked with the first telescopic element 121, so that the electromagnetic telescopic mechanism 10 is unfolded; upon receiving a second signal from the controller, the second telescopic element 122 rotates under the action of the magnetic field and is unlocked from the first telescopic element 121, so that the electromagnetic telescopic mechanism 10 is curled.

It should be noted that in the disclosed embodiment, the telescopic tube 12 is made of an insulating soft material such as plastic, organic resin, etc. to ensure that the telescopic tube 12 can be rolled and unrolled under the cooperation of the first telescopic element 121 and the second telescopic element 122. The first telescopic element 121 and the second telescopic element 122 are made of hard insulating materials such as ceramic and plastic, so that the first telescopic element 121 and the second telescopic element 122 are not deformed obviously during locking and unlocking processes.

Figure 8:
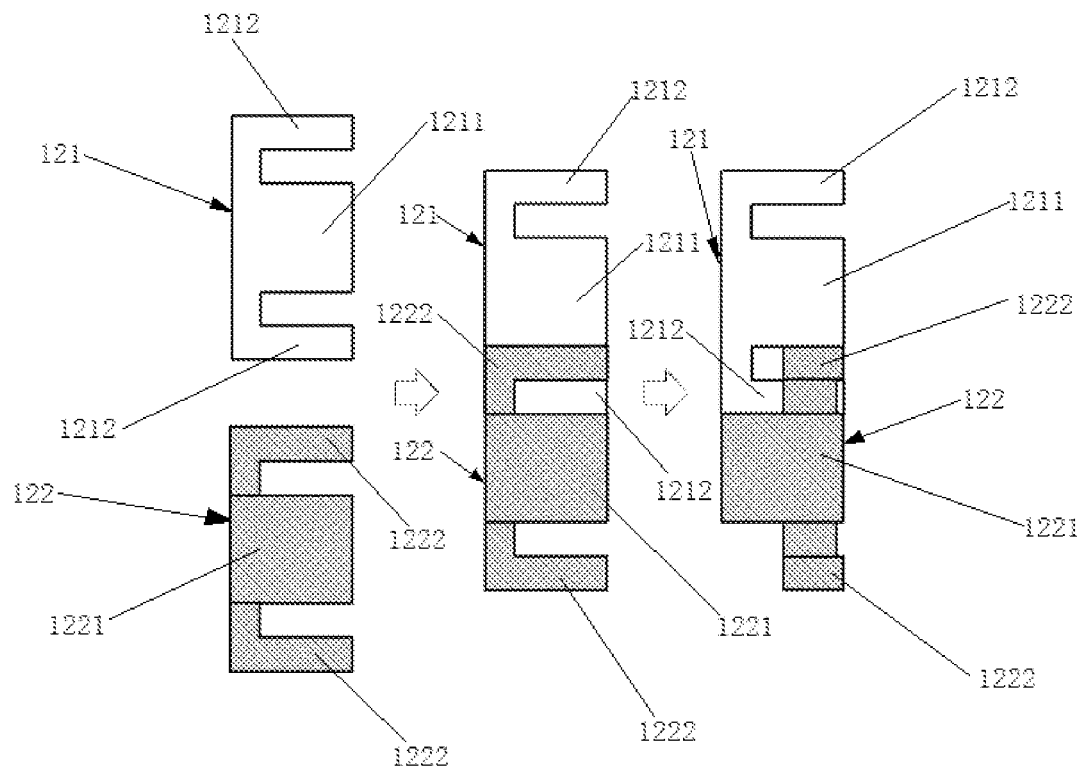
FIG. 8 is a schematic view of a locking process for the first telescoping element and the second telescoping element of the curling device of FIG. 7 according to an embodiment of the present disclosure.

In one embodiment of the present disclosure, as shown in FIG. 8, a schematic view of the locking process of the first telescoping element and the second telescoping element is shown. The first telescopic member 121 includes a first telescopic member body 1211 and first locking mechanisms 1212 provided at both ends of the first telescopic member body 1211 the second telescopic member includes a second telescopic member body 1221 and a second locking mechanism 1222 arranged at two ends of the second telescopic member body 1221, the second telescopic member body 1221 being wound with a coil; the first 1212 and second 1222 locking mechanisms mate for locking and unlocking the first telescoping element 121 and the second telescoping element 122.

In the disclosed embodiment, the first telescopic element body 1211 and the second telescopic element body 1221 are both cylindrical and have shapes matched with the telescopic cylinder 12; the first locking mechanism 1212 and the second locking mechanism 1222 are mating snap-fit structures. The first locking mechanism 1212 and the second locking mechanism 1222 are in an unlocked state, and the first telescopic element 121 and the second telescopic element 122 are moved at the connection position by an external force, so that the telescopic tube 12 is curled, and the electromagnetic telescopic mechanism 10 is curled. When the first locking mechanism 1212 and the second locking mechanism 1222 are in the locked state, relative movement between the first telescopic element 121 and the second telescopic element 122 does not occur, so that the telescopic cylinder 12 is flattened, and the electromagnetic telescopic mechanism 10 is flattened.

It should be noted that the first telescoping element 121 and the second telescoping element 122 can be made by integral molding or cut molding.

Figure 9:
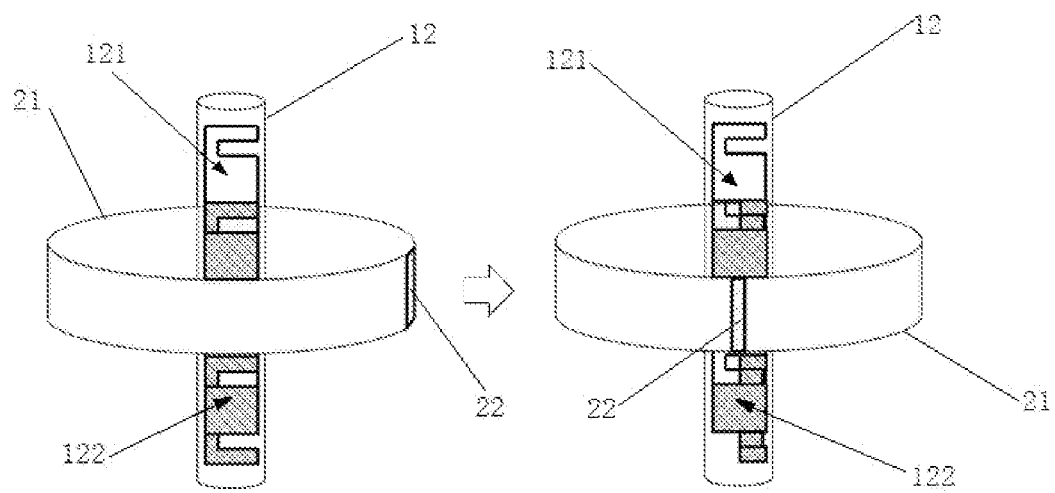
FIG. 9 is a schematic view of the operation of the controller of the curling device of FIG. 7 according to an embodiment of the present disclosure.

In one embodiment of the present disclosure, as shown in FIG. 9, a schematic view of the operation of the controller in the curling device of FIG. 7 is shown. The curling device further comprises an circular track 21 and an electromagnet 22; an circular track 21 surrounds telescopic cylinder 12; the electromagnetic member 22 is provided to be movable along the circular rail 21 so that the first locking mechanism 1212 and the second locking mechanism 1222 are locked or unlocked.

In the disclosed embodiment, the telescopic cylinder 12 is located at the center of the circular track 21, the circular track 21 surrounds the telescopic cylinder 12, and the electromagnetic member 22 can move along the circular track 21. With the coil of the second telescoping element 122 energized, when the second telescoping element 122 passes through the circular track 21, the second telescoping element 122 rotates under the magnetic field of the electromagnet 22, causing the first and second locking mechanisms 1212, 1222 to lock or unlock.

It should be noted that to ensure that the second telescopic element 122 can be rotated to effect locking with and with the first telescopic element 121. The direction of the magnetic field generated by the coil in the second telescopic element 122 is perpendicular to the plane of the circular track 21, so as to ensure that the magnetic field of the electromagnetic component 22 can attract or repel the second telescopic element 122, and make the second telescopic element 122 rotate to a specified position.

In one embodiment of the present disclosure, when the electromagnetic component 22 moves to the first position along the circular track 21, the second telescopic element 122 rotates to the locking position under the magnetic field of the electromagnetic component 21, and the second locking mechanism 1222 is locked with the first locking mechanism 1212; when the electromagnetic member 22 moves to the second position along the circular track 21, the second telescopic element 122 rotates to the unlocking position under the action of the magnetic field of the electromagnetic member 21, and the second locking mechanism 1222 and the first locking mechanism 1212 are unlocked.

Specifically, when the second telescopic element 122 passes through the circular track 21, the coil power supply in the second telescopic element 122 is simultaneously turned on under the action of the controller, at this time, the electromagnetic element 22 moves to the first position along the circular track 21 under the action of the controller, the magnetic field of the second telescopic element 122 interacts with the magnetic field of the electromagnetic element 21, because the position of the electromagnetic element 21 is fixed, the second telescopic element 122 rotates relative to the electromagnetic element 21 until the second telescopic element rotates to the locking position, the second locking mechanism 1222 is locked with the first locking mechanism 1212, and at this time, in order to ensure the locking effect of the second locking mechanism 1222 and the first locking mechanism 1212, the controller cuts off the power supply to the coil in the second telescopic element 122. Similarly, by the controller controlling the electromagnetic component 22 to move to the second position along the circular track 21, the second telescopic element 122 will rotate relative to the electromagnetic component 21 until the second locking mechanism 1222 and the first locking mechanism 1212 are unlocked when the controller rotates to the unlocking position.

In one embodiment of the present disclosure, the curling device further includes a box 40 and a pipe 41 arranged in the box 40, the pipe 41 being used for the electromagnetic telescoping mechanism 10 to enter and exit the box 40; one side of the pipe 41 is provided with a supporting transmission mechanism 50 for supporting the electromagnetic telescopic mechanism 10 and driving the electromagnetic telescopic mechanism 10 to move.

In the embodiment of the present disclosure, the case 40 is provided for accommodating the electromagnetic: telescopic mechanism 10, the rotating shaft 30, the support transmission mechanism 50, the flexible display panel element, and the like, so as to protect the above components. In order to facilitate the electromagnetic telescoping mechanism 10 to enter or exit the box 40, a pipeline 41 for the electromagnetic telescoping mechanism 10 to enter or exit is provided. Meanwhile, in order to further control the movement of the electromagnetic telescoping mechanism 10 and ensure the stability of the electromagnetic telescoping mechanism 10 during the movement process, a supporting transmission mechanism 50 is arranged on one side of the pipeline 41 and configured to support the electromagnetic telescoping mechanism 10 and driving the electromagnetic telescoping mechanism 10 to move, the rotating direction of the supporting transmission mechanism 50 is opposite to that of the rotating shaft 30, and the rotating linear speeds of the rotating shaft 30 and the rotating shaft are kept consistent, so that the efficiency and the speed of expanding and curling of the electromagnetic telescoping mechanism 10 can be further improved by controlling the rotating direction and the rotating speed of the rotating shaft 30 and the supporting transmission mechanism 50.

Figure 10:
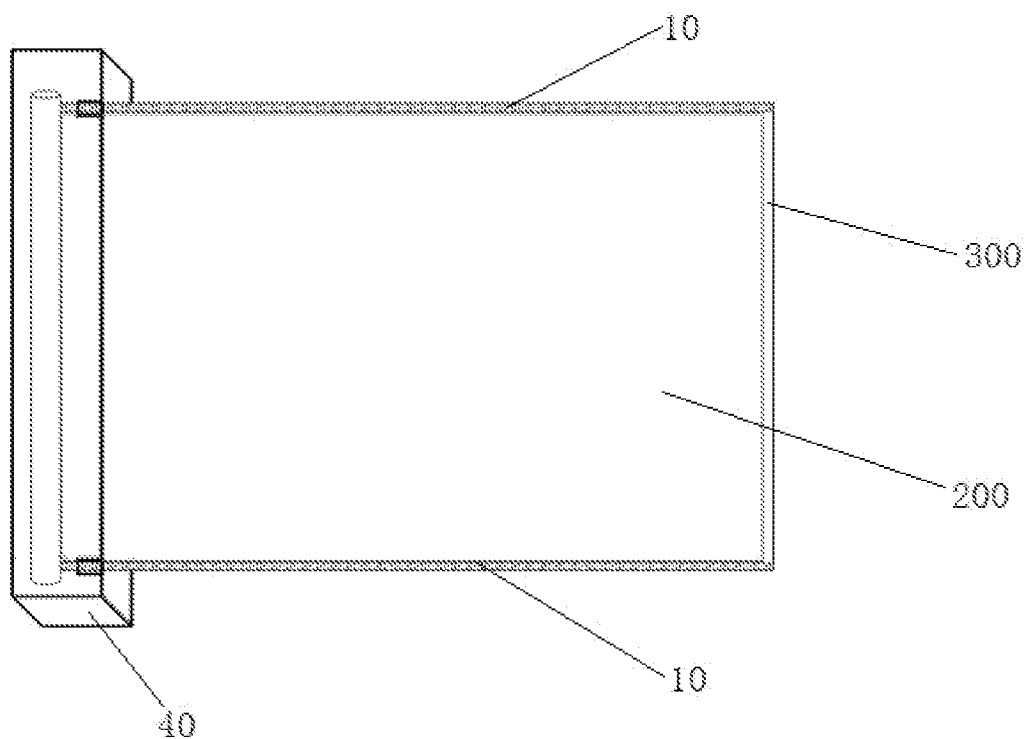
FIG. 10 is a schematic view of a flat state of a flexible display device according to an embodiment of the present disclosure.
Figure 11:
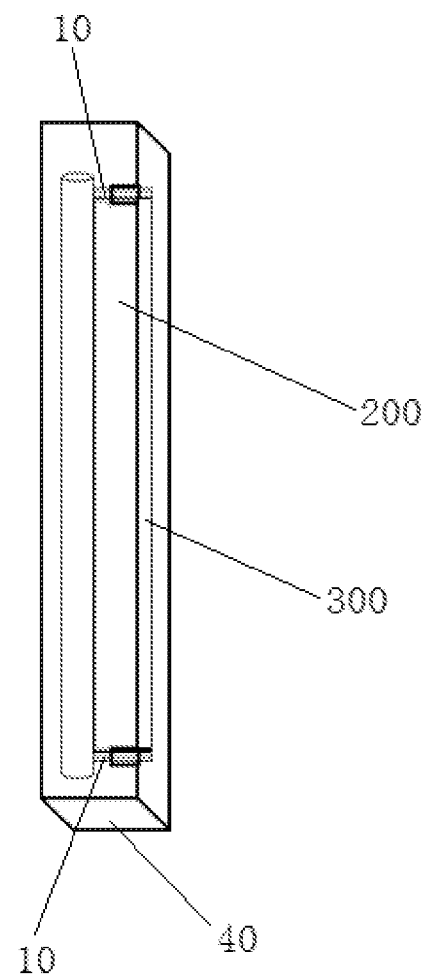
FIG. 11 is a schematic view of a curling state of a flexible display device according to an embodiment of the present disclosure.

In a second aspect, embodiments of the present disclosure provide a flexible display device, as shown in FIG. 10, which is a schematic view of a flattened state of the flexible display device; FIG. 11 is a schematic view of a rolled state of the flexible display device. The flexible display device comprises a flexible display panel element 200 and a rolling device provided by the above embodiments; the flexible display panel element 200 is connected to the electromagnetic stretching mechanism 10 of the curling device, and the flexible display panel element 200 is driven to expand or curl by the electromagnetic stretching mechanism 10.

In the embodiment of the present disclosure, when the flexible display device is required to be used for displaying, the flexible display panel element 200 is driven to exit from the box 40 of the curling device by controlling the electromagnetic telescopic mechanism 10, so as to realize the expanding of the flexible display panel element 200. After using, continue to drive flexible display panel element 200 through control electromagnetic telescoping mechanism 10 and get into curling device's box 40, realize curling of flexible display panel element 200 to convenient for accommodating and carrying.

Optionally, a fixing member 300 is arranged on a first side of the flexible display panel element 200; the fixing member 300 is made of hard material, and the first side edge of the flexible display panel element 200 is fixed by the fixing member 300, so that the flexible display panel element 200 is prevented from being bent in the using process. In order to improve the stability of the flexible display device, in the embodiment of the present disclosure, two adjacent sides of the flexible display panel element 200 and the first side are provided with the electromagnetic telescopic mechanisms 10, and one end of each electromagnetic telescopic mechanism 10 is connected and fixed to the fixing member 300.

Optionally, the electromagnetic telescoping mechanism includes a plurality of electromagnetic telescoping elements;

the flexible display panel element is clamped between the crawler belt and the electromagnetic element;

any two adjacent electromagnetic telescopic elements are provided with gaps between the electromagnetic elements, the electromagnetic elements comprise coils, and the electric polarities of coil terminals in any two adjacent electromagnetic elements are opposite.

Optionally, the electromagnetic telescopic mechanism is further connected with a rotating shaft, and the rotating shaft is used for driving the electromagnetic telescopic mechanism to move.

Optionally, the electromagnetic telescopic element further comprises a supporting member, an elastic member and a connecting shaft;

the crawler belts of any two adjacent electromagnetic telescopic elements are connected through the connecting shaft;

the support member is arranged in the crawler belt and connected with the connecting shaft;

the elastic piece is arranged in the crawler belt, and two ends of the elastic piece are respectively connected with the support member and the side wall of the crawler belt close to the electromagnetic element and provide pressure for the support member.

Optionally, an included angle between the crawler belts of two adjacent electromagnetic telescopic elements ranges from 140° to 180°.

Optionally, the cross section of the electromagnetic element in the direction perpendicular to the length direction of the crawler belt is trapezoidal.

Optionally, the coil of the electromagnetic element is provided with a circuit switch;

the circuit switch is configured to receive the first signal and the second signal and controlling the connection and the disconnection of the coil and a power supply according to the first signal and the second signal.

By applying the embodiment of the disclosure, the following beneficial effects can be at least realized:

the curling device that this disclosed embodiment provided includes: the electromagnetic telescoping mechanism and the controller are in communication connection; the electromagnetic telescopic mechanism is configured to connect with the flexible display panel element and expanding under the action of the magnetic field when receiving a first signal of the controller so as to drive the flexible display panel element to expand; when a second signal of the controller is received, the flexible display panel element is curled, so that the flexible display panel element is driven to curl. The controller 20 controls the electromagnetic telescoping mechanism 10 to flatten and curl, so that the flexible display panel element connected with the electromagnetic telescoping mechanism 10 can be unfolded and curled effectively.

In the description of the present disclosure, it is to be understood that the terms "center", "upper", "lower", "front", "rear", "left", "right", "vertical", "horizontal", "top", "bottom" "inner", "outer", and the like indicate orientations or positional relationships based on those shown in the drawings, merely for convenience in describing the present disclosure and simplifying the description, and do not indicate or imply that the device or element referred to must have a particular orientation, be constructed in a particular orientation, and be operated, and therefore, should not be construed as limiting the present disclosure.

The terms "first". "second" and "first" are used for descriptive purposes only and are not to be construed as indicating or implying relative importance or to implicitly indicate the number of technical features indicated. Thus, a feature defined as "first" or "second" may explicitly or implicitly include one or more of that feature. In the description of the present disclosure, the meaning of "a plurality" is two or more unless otherwise specified.

In the description of the present disclosure, it should be noted that, unless otherwise explicitly stated or limited, the terms "mounted," "connected," and "connected" are to be construed broadly, e.g., as being fixedly connected, detachably connected, or integrally connected; they may be connected directly or indirectly through intervening media, or they may be interconnected between two elements. The specific meaning of the above terms in the present disclosure can be understood in a specific case to those of ordinary skill in the art.

The particular features, structures, materials, or characteristics may be combined in any suitable manner in any one or more embodiments or examples.

The foregoing is illustrative of only some embodiments of the disclosure, and it will be appreciated by those skilled in the art that various modifications and adaptations can be made without departing from the principles of the disclosure, and are intended to be within the scope of the disclosure.

What is claimed is:

1. A curling device, comprising: an electromagnetic telescoping mechanism and a controller in a communication connection, wherein
the electromagnetic telescopic mechanism is configured to:
connect with a flexible display panel element, and expand under an action of a magnetic field when receiving a first signal of the controller to drive the flexible display panel element to expand; and
when receiving a second signal of the controller, curl to drive the flexible display panel element to curl.

2. The curling device of claim 1, wherein the electromagnetic telescoping mechanism comprises a plurality of electromagnetic telescoping elements;
each flexible display panel element comprises a crawler belt and an electromagnetic element, and is clamped between the crawler belt and the electromagnetic element;
there exists a gap between the electromagnetic elements of two adjacent electromagnetic telescopic elements, the electromagnetic elements comprise a coil, and electric polarities of coil terminals in two adjacent electromagnetic elements are opposite.

3. The curling device of claim 2, wherein the electromagnetic telescoping mechanism is further coupled to a rotating shaft, the rotating shaft is configured to move the electromagnetic telescoping mechanism.

4. The curling device of claim 2, wherein the electromagnetic telescoping element further comprises a support member, an elastic member, and a connecting shaft;
the crawler belts of two adjacent electromagnetic telescopic elements are connected through the connecting shaft;
the support member is arranged in the crawler belt and connected with the connecting shaft;
the elastic piece is arranged in the crawler belt, and two ends of the elastic piece are respectively connected with the support member and a side wall of the crawler belt close to the electromagnetic element and are configured to provide a pressure for the support member.

5. The curling device of claim 4; wherein an angle between the crawler belts of two adjacent electromagnetic telescopic elements is in a range of 140°-180°.

6. The curling device of claim 4, wherein the electromagnetic element is trapezoidal in a cross-section perpendicular to a length of the crawler belt.

7. The curling device of claim 2, wherein the coil of the electromagnetic element is provided with a circuit switch;
the circuit switch is configured to receive a first signal and a second signal and control a connection and a disconnection of the coil and a power supply in response to the first signal and the second signal.

8. The curling device of claim 1, wherein the electromagnetic telescoping mechanism comprises a telescoping cylinder and at least one first telescoping element and at least one second telescoping element arranged within the telescoping cylinder;
the at least one first telescoping element and the at least one second telescoping element are arranged alternately;
the first telescopic element is fixedly connected with the telescopic cylinder;
the second telescopic element is provided with a coil and is configured to:

rotate under an action of a magnetic field and lock with the first telescopic element when receiving the first signal, to enable the electromagnetic telescopic mechanism to expand, and rotate under an action of a magnetic field and is unlocked with the first telescopic element when receiving the second signal, to enable the electromagnetic telescopic mechanism to curl.

9. The curling device of claim 8, wherein the first telescoping element comprises a first telescoping element body and first locking mechanisms arranged at both ends of the first telescoping element body;

the second telescopic element comprises a second telescopic element body and second locking mechanisms arranged at two ends of the second telescopic element body, and a coil is twined on the second telescopic element body;

the first locking mechanism is matched with the second locking mechanism, to lock and unlock the first telescopic element and the second telescopic element.

10. The curling device of claim 9, wherein the controller comprises an circular track and an electromagnetic element;

the circular track surrounds the telescopic cylinder;

the electromagnetic member is configured to be movable along the circular track to lock and unlock the first locking mechanism and the second locking mechanism.

11. The curling device of claim 10, wherein when the electromagnetic element moves to a first position along the circular track, the second telescopic element rotates to a locking position under an action of a magnetic field of the electromagnetic element, and the second locking mechanism is locked with the first locking mechanism;

when the electromagnetic element moves to a second position along the circular track, the second telescopic element rotates to an unlocking position under the action of the magnetic field of the electromagnetic element, and the second locking mechanism is unlocked with the first locking mechanism.

12. The curling device of claim 1, further comprising a housing and a pipe arranged within the housing for the electromagnetic telescoping mechanism to enter and exit the housing;

a support transmission mechanism is arranged on a side of the pipe and is configured to support the electromagnetic telescopic mechanism and drive the electromagnetic telescopic mechanism to move.

13. A flexible display device, comprising a flexible display panel element and a curling device;

wherein the curling device comprises: an electromagnetic telescoping mechanism and a controller in a communication connection, wherein the electromagnetic telescopic mechanism is configured to:

connect with a flexible display panel element, and expand under an action of a magnetic field when receiving a first signal of the controller to drive the flexible display panel element to expand; and when receiving a second signal of the controller, curl to drive the flexible display panel element to curl.

14. The flexible display device according to claim 13, wherein a fixing member is arranged at a first side of the flexible display panel element;

at least one side edge of the flexible display panel element, which is adjacent to the first side edge, is connected with the electromagnetic telescopic mechanism.

15. The flexible display device of claim 13, wherein the electromagnetic telescoping mechanism comprises a plurality of electromagnetic telescoping elements;

each flexible display panel element comprises a crawler belt and an electromagnetic element, and is clamped between the crawler belt and the electromagnetic element;

there exists a gap between the electromagnetic elements of two adjacent electromagnetic telescopic elements, the electromagnetic elements comprise a coil, and electric polarities of coil terminals in two adjacent electromagnetic elements are opposite.

16. The flexible display device of claim 15, wherein the electromagnetic telescoping mechanism is further coupled to a rotating shaft, the rotating shaft is configured to move the electromagnetic telescoping mechanism.

17. The flexible display device of claim 15, wherein the electromagnetic telescoping element further comprises a support member, an elastic member, and a connecting shaft;

the crawler belts of two adjacent electromagnetic telescopic elements are connected through the connecting shaft;

the support member is arranged in the crawler belt and connected with the connecting shaft;

the elastic piece is arranged in the crawler belt, and two ends of the elastic piece are respectively connected with the support member and a side wall of the crawler belt close to the electromagnetic element and are configured to provide a pressure for the support member.

18. The flexible display device of claim 17, wherein an angle between the crawler belts of two adjacent electromagnetic telescopic elements is in a range of 140°-180°.

19. The flexible display device of claim 17, wherein the electromagnetic element is trapezoidal in a cross-section perpendicular to a length of the crawler belt.

20. The flexible display device of claim 15, wherein the coil of the electromagnetic element is provided with a circuit switch;

the circuit switch is configured to receive a first signal and a second signal and control a connection and a disconnection of the coil and a power supply in response to the first signal and the second signal.

* * * * *